(12) United States Patent
Kang (10) Patent No.: US 7,583,548 B2
(45) Date of Patent: Sep. 1, 2009

(54) SEMICONDUCTOR MEMORY APPARATUS FOR ALLOCATING DIFFERENT READ/WRITE OPERATING TIME TO EVERY BANK

(75) Inventor: Khil-Ohk Kang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 118 days.

(21) Appl. No.: 11/822,655

(22) Filed: Jul. 9, 2007

(65) Prior Publication Data

US 2008/0089149 A1    Apr. 17, 2008

(30) Foreign Application Priority Data

Oct. 12, 2006    (KR) .................... 10-2006-0099545

(51) Int. Cl.
*G11C 7/02* (2006.01)
(52) U.S. Cl. ...................... 365/207; 365/194
(58) Field of Classification Search ................ 365/207, 365/194, 222
See application file for complete search history.

(56) References Cited

U.S. PATENT DOCUMENTS

| | | | |
|---|---|---|---|
| 5,572,475 A * | 11/1996 | Yim et al. | ................... 365/208 |
| 5,966,337 A | 10/1999 | Lee et al. | |
| 6,043,685 A | 3/2000 | Lee | |
| 6,097,653 A | 8/2000 | Park | |
| 6,347,058 B1 | 2/2002 | Houghton et al. | |
| 7,002,862 B2 | 2/2006 | Kang | |
| 7,012,847 B2 * | 3/2006 | Song | ........................ 365/205 |
| 2006/0111865 A1 | 5/2006 | Choi | |
| 2007/0247942 A1 * | 10/2007 | Park | ........................ 365/208 |

FOREIGN PATENT DOCUMENTS

| | | |
|---|---|---|
| JP | 10340583 | 12/1998 |
| JP | 2000-011656 | 1/2000 |
| JP | 2002230978 | 8/2002 |
| KR | 10-1998-0057449 | 9/1998 |
| KR | 1020020042030 | 6/2002 |
| KR | 1020030050181 | 6/2003 |
| KR | 1020040053911 | 6/2004 |
| KR | 1020050101872 | 10/2005 |

* cited by examiner

*Primary Examiner*—Anh Phung
(74) *Attorney, Agent, or Firm*—Venable LLP; Jeffri A. Kaminski (57) ABSTRACT

A semiconductor memory apparatus includes an active signal generation unit that generates a plurality of active signals having different enable timings in response to a refresh signal, a precharge signal generation unit that delays at least one of the active signals to generate at least one precharge signal for enabling at least two equalizer signals at the same time, and a sense amplifier driver control unit that generates the plurality of equalizer signals for controlling individual sense amplifier drivers in response to the plurality of active signals and the precharge signal.

12 Claims, 11 Drawing Sheets

SEMICONDUCTOR MEMORY APPARATUS FOR ALLOCATING DIFFERENT READ/WRITE OPERATING TIME TO EVERY BANK

CROSS-REFERENCE TO RELATED PATENT APPLICATION

This application claims the benefit of Korean Patent Application No. 10-2006-0099545, filed on Oct. 12, 2006, in the Korean Intellectual Property Office, the disclosure of which is incorporated herein in its entirety by reference.

BACKGROUND OF THE INVENTION

1. Technical Field

The present invention relates to a semiconductor memory apparatus, and more particularly, to a semiconductor memory apparatus that allocates different read/write operating time to every bank.

2. Related Art

Generally, in a semiconductor memory apparatus, data is stored in a capacitor of a memory cell. At this time, the semiconductor memory apparatus performs a periodic refresh operation in order to retain the data of the cell. Then, the semiconductor memory apparatus reads or writes the data through bit lines, and precharges the used bit lines with a predetermined voltage.

A general semiconductor memory apparatus sequentially performs a refresh operation, a read/write operation, and a precharge operation. The operating specifications of the semiconductor memory apparatus are described in the standards issued by JEDEC (Joint Electron Device Engineering Council), which is an international standardization organization that deliberates and issues the unified standards for electronic devices, such as integrated circuits (IC)). In compliance with the JEDEC standards, the semiconductor memory apparatus needs to ensure a time required until a precharge operation is completed after a refresh operation (hereinafter, the time is referred to as "tRC"), a time required until a read/write operation is completed (hereinafter, referred to as "tRAS"), and a time required until a precharge operation is completed (hereinafter, referred to as "tRP") That is, the tRC is a time between an active signal and a precharge signal, and the tRAS and the tRP need to be ensured in the tRC.

However, the semiconductor memory apparatus according to the related art may have the same tRC with respect to each of the active signals that are sequentially input. In this case, the same tRC may cause an error in a bank that has a slow response speed with respect to the read/write operation.

SUMMARY OF THE INVENTION

An embodiment of the present invention provides a semiconductor memory apparatus that allocates different read/write operating time to every bank having different response speeds.

Another embodiment of the present invention provides a semiconductor memory apparatus that ensures the minimum read/write operating time according to the JEDEC standards and extends the read/write operating time as much as needed.

According to an embodiment of the present invention, a semiconductor memory apparatus includes an active signal generation unit that generates a plurality of active signals having different enable timings in response to a refresh signal, a precharge signal generation unit that delays at least one active signal to generate at least one precharge signal for enabling at least two equalizer signals at the same time, and a sense amplifier driver control unit that generates the plurality of equalizer signals for controlling individual sense amplifier drivers in response to the plurality of active signals and the precharge signal.

According to another embodiment of the present invention, a semiconductor memory apparatus includes an active signal generation unit that generates a plurality of active signals having different enable timings in response to a refresh signal, a precharge signal generation unit that delays one active signal having a latest enable timing to generate a precharge signal for enabling all equalizer signals, and a sense amplifier driver control unit that generates the plurality of equalizer signals for controlling individual sense amplifier drivers in response to the plurality of active signals and the precharge signal.

According to still another embodiment of the present invention, a semiconductor memory apparatus includes an active signal generation unit that generate a plurality of active signals having different enable timings in response to a refresh signal, a sense amplifier driver control unit that includes a plurality of sense amplifier driver controllers, each of which receives the corresponding active signal and a precharge signal, and a precharge signal generation unit that includes at least one delay unit, which delays at least one active signal to output the precharge signal. At least one precharge signal is commonly output to at least two sense amplifier driver controllers.

DESCRIPTION OF EXEMPLARY EMBODIMENTS

Exemplary embodiments of the present invention will now be described in detail with reference to the accompanying drawings.

Figure 1:
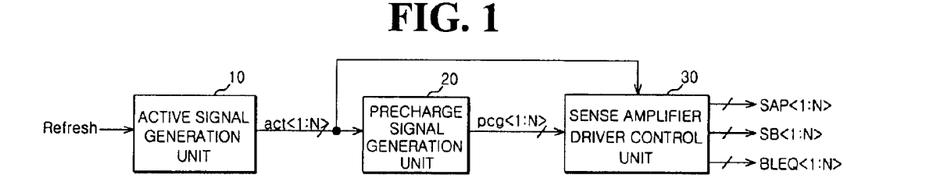
FIG. 1 is a block diagram illustrating a semiconductor memory apparatus according to an embodiment of the present invention.

Referring to FIG. 1, a semiconductor memory apparatus according to an embodiment of the present invention includes an active signal generation unit 10, a precharge signal generation unit 20, and a sense amplifier driver control unit 30.

The active signal generation unit 10 receives a refresh signal Refresh to generate a plurality of active signals act<1:N> having different enable timings.

The precharge signal generation unit 20 delays the plurality of active signals act<1:N> to generate a plurality of precharge signals pcg<1:N>.

The sense amplifier driver control unit 30 receives the plurality of precharge signals pcg<1:N> and the plurality of active signals act<1:N>, to generate a plurality of pull-up signals SAP<1:N>, a plurality of pull-down signals SB<1:N>, and a plurality of equalizer signals BLEQ<1:N> for controlling individual sense amplifier drivers. Here, the pull-up signals, the pull-down signals, and the equalizer signals are used to control the sense amplifier drivers.

In this embodiment, it is assumed that the active signal generation unit 10 generates first to fourth active signals act<1:4>, and the first to fourth active signals act<1:4> are enabled in such a way that the first active signal act1, the second active signal act2, the third active signal act3, and the fourth active signal act4 are sequentially enabled. Further, first to fourth delay units 21 to 24 have the same delay time.

Figure 2:
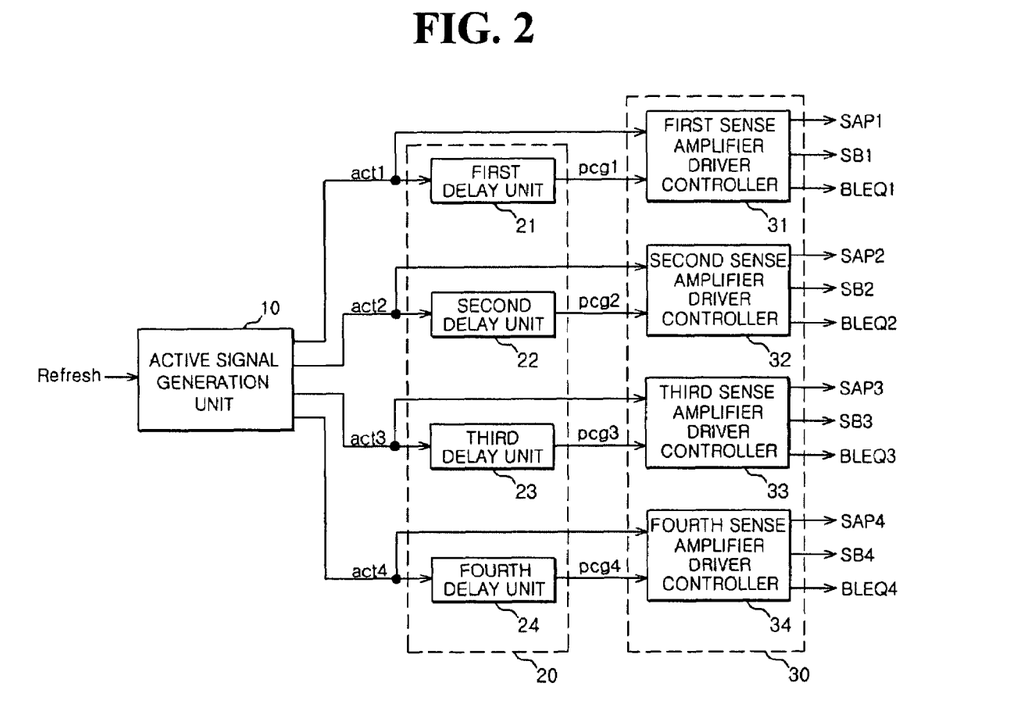
FIG. 2 is a diagram illustrating the detailed structure of the semiconductor memory apparatus according to an embodiment of the present invention.

A detailed description will be given with reference to FIG. 2. The active signal generation unit 10 delays the refresh signal Refresh to generate the first to fourth active signals act<1:4> having different enable timings.

The first to fourth active signals act<1:4> are correspondingly input to the first to fourth delay units 21 to 24 that have the same delay time, and then precharge signals pcg<1:4> having different enable timings are output.

The sense amplifier driver control unit 30 includes first to fourth sense amplifier driver controllers 31, 32, 33, and 34.

The first sense amplifier driver controller 31 generates a first pull-up signal SAP1, a first pull-down signal SB1, and a first equalizer signal BLEQ1 in response to the first active signal act1 and the first precharge signal pcg1.

The second sense amplifier driver controller 32 generates a second pull-up signal SAP2, a second pull-down signal SB2, and a second equalizer signal BLEQ2 in response to the second active signal act2 and the second precharge signal pcg2.

The third sense amplifier driver controller 33 generates a third pull-up signal SAP3, a third pull-down signal SB3, and a third equalizer signal BLEQ3 in response to the third active signal act3 and the third precharge signal pcg3.

The fourth sense amplifier driver controller 34 generates a fourth pull-up signal SAP4, a fourth pull-down signal SB4, and a fourth equalizer signal BLEQ4 in response to the fourth active signal act4 and the fourth precharge signal pcg4.

Figure 3:
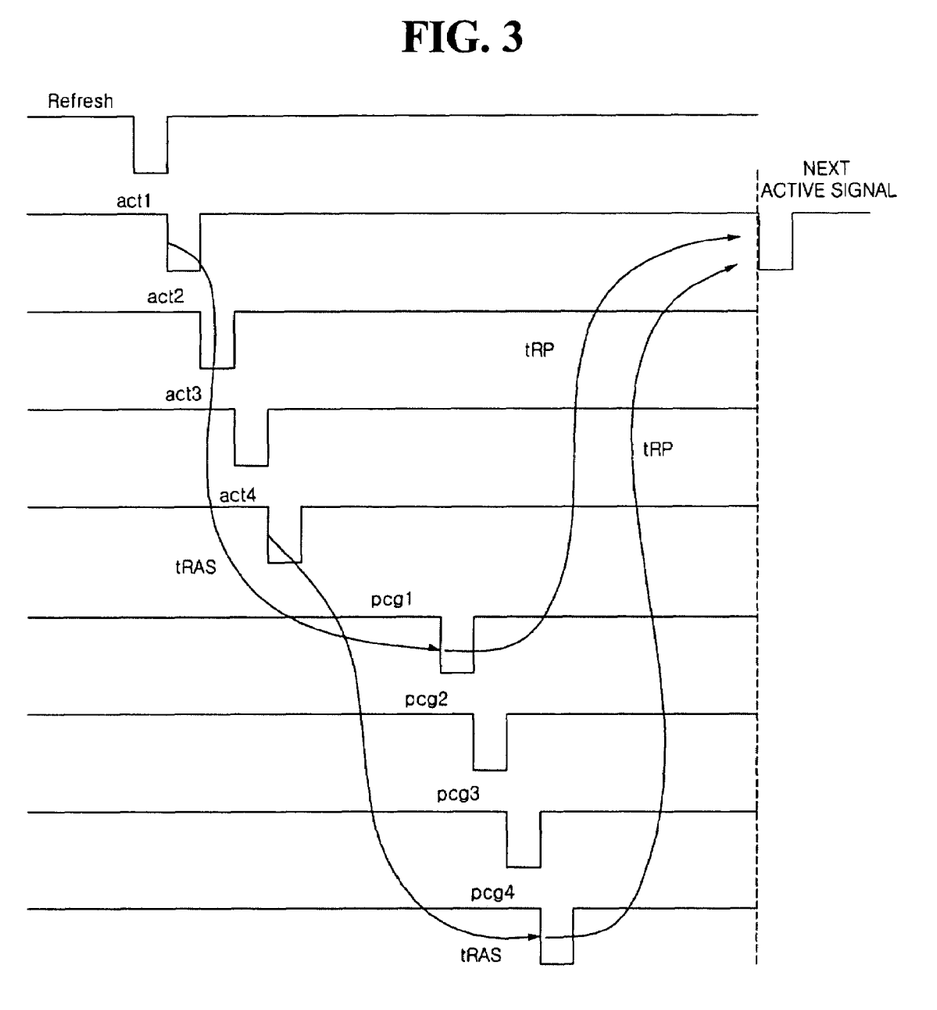
FIG. 3 is a timing chart illustrating the semiconductor memory apparatus according to an embodiment of the present invention.

As shown in FIG. 3, the semiconductor memory apparatus is designed so as to enable the first to fourth active signals act1 to act4 in the order under the above assumption after the refresh signal Refresh is enabled. Since the first to fourth precharge signal pcg1 to pcg4 are generated by delaying the first to fourth active signals act1 to act4 for the same delay time, the first precharge signal pcg1 has a fastest enable timing, and the fourth precharge signal pcg4 has a latest enable timing.

According to the JEDEC standards, the time required until the first precharge signal pcg1 is enabled after the first active signal act1 is enabled, that is, the tRAS needs to be ensured. Therefore, when the tRAS between the enabled first active signal act1 and the enabled first precharge signal pcg1 is ensured, the tRAS between each of the second to fourth active signals act2 to act4 and each of the second to fourth precharge signals pcg2 to pcg4 is also ensured. This is because the first to fourth precharge signals pcg1 to pcg4 are generated by delaying the active signals act<1:4> for the same delay time. That is, the time delayed by each of the first to fourth delay units 21 to 24 is the tRAS.

Further, the time between from when each of the first to fourth precharge signals pcg1 to pcg4 is enabled until when the next active signal is enabled, that is, the tRP needs to be ensured.

In the semiconductor memory apparatus having the above-described structure, the tRAS between the first active signal act1 and the first precharge signal pcg1 may be the same as the tRAS between each of the second to fourth active signals act2 to act4 and each of the second to fourth precharge signals pcg2 to pcg4. Further, when the tRP between the fourth precharge signal pcg4 and the next active signal is ensured, the tRP of each of the first to third precharge signals pcg1 to pcg3 is also ensured. However, in this embodiment, the delay units are provided to correspond to the respective active signals. Therefore, the reduction in area of the semiconductor memory apparatus is limited.

Figure 4:
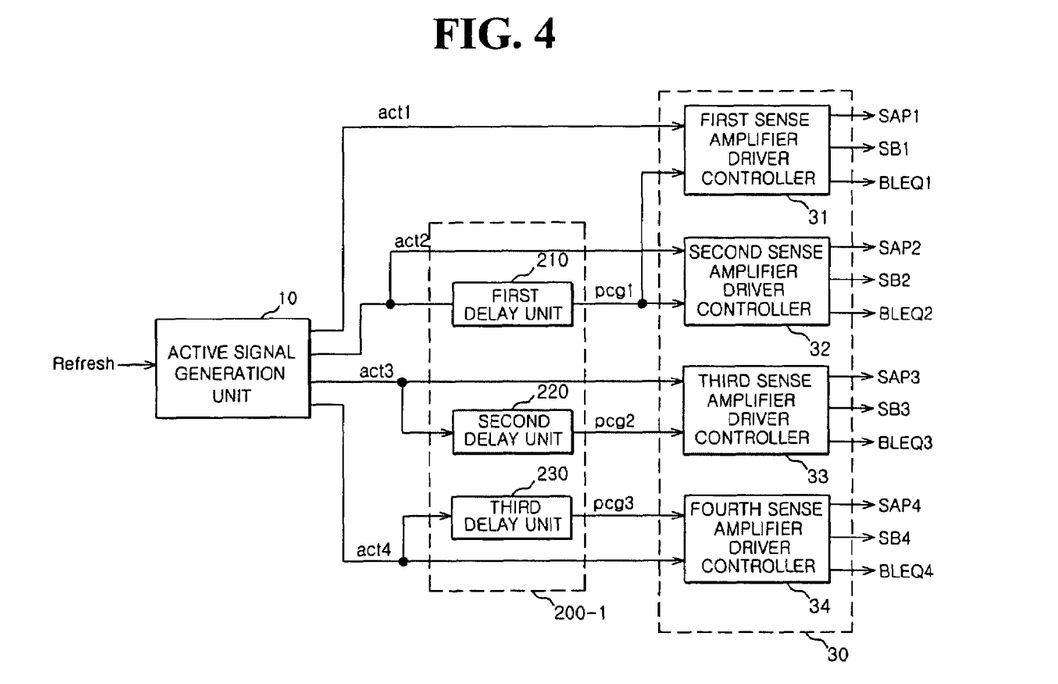
FIG. 4 is a diagram illustrating the detailed structure of a semiconductor memory apparatus according to another embodiment of the present invention.

To overcome this problem, as show in FIG. 4, there is a method that shares delay units. A semiconductor memory apparatus shown in FIG. 4 may include an active signal generation unit 10, a precharge signal generation unit 200-1, and a sense amplifier driver control unit 30. At this time, it is assumed that the semiconductor memory apparatus includes four banks, each of which includes a sense amplifier driver and a sense amplifier driver controller. Further, it is assumed that the active signals for activating the banks are enabled in such a way that the first active signal, the second active signal, the third active signal, and the fourth active signal are sequentially enabled. That is, the first active signal has a fastest enable timing.

The active signal generation unit 10 delays a refresh signal Refresh to generate first to fourth active signals act1 to act4 having different enable timings for generating four pull-up signals SAP1 to SAP4 and four pull-down signals SB1 to SB4.

The precharge signal generation unit 200-1 delays the second active signal act2 to generate a first precharge signal pcg1 for enabling first and second equalizer signals BLEQ1 and BLEQ2 at the same time. The precharge signal generation unit 200-1 delays the third and fourth active signals act3 and act4 to enable second and third precharge signals pcg3 and pcg4.

The precharge signal generation unit 200-1 includes first, second, and third delay units 210, 220, and 230. At this time, the first delay unit 210, the second delay unit 220, and the third delay unit 230 receive the second active signal act2, the third active signal act3, and the fourth active signal act4 to generate the first to third precharge signals pcg1 to pcg3, respectively. Moreover, the delay units 210, 220, and 230 apply the same delay time.

The sense amplifier driver control unit 30 generates pull-up signals SAP1 to SAP4, pull-down signals SB1 to SB4, and equalizer signals BLEQ1 to BLEQ4 for controlling individual sense amplifier drivers in response to the first to fourth active signals act1 to act4 and the first to third precharge signals pcg1 to pcg3.

The sense amplifier driver control unit 30 includes first to fourth sense amplifier driver controllers 31, 32, 33, and 34 that correspondingly receive the active signals act1 to act4 and the precharge signals pcg1 to pcg3. At this time, the first and second sense amplifier driver controllers 31 and 32 commonly receive the first precharge signal pcg1.

Figure 5:
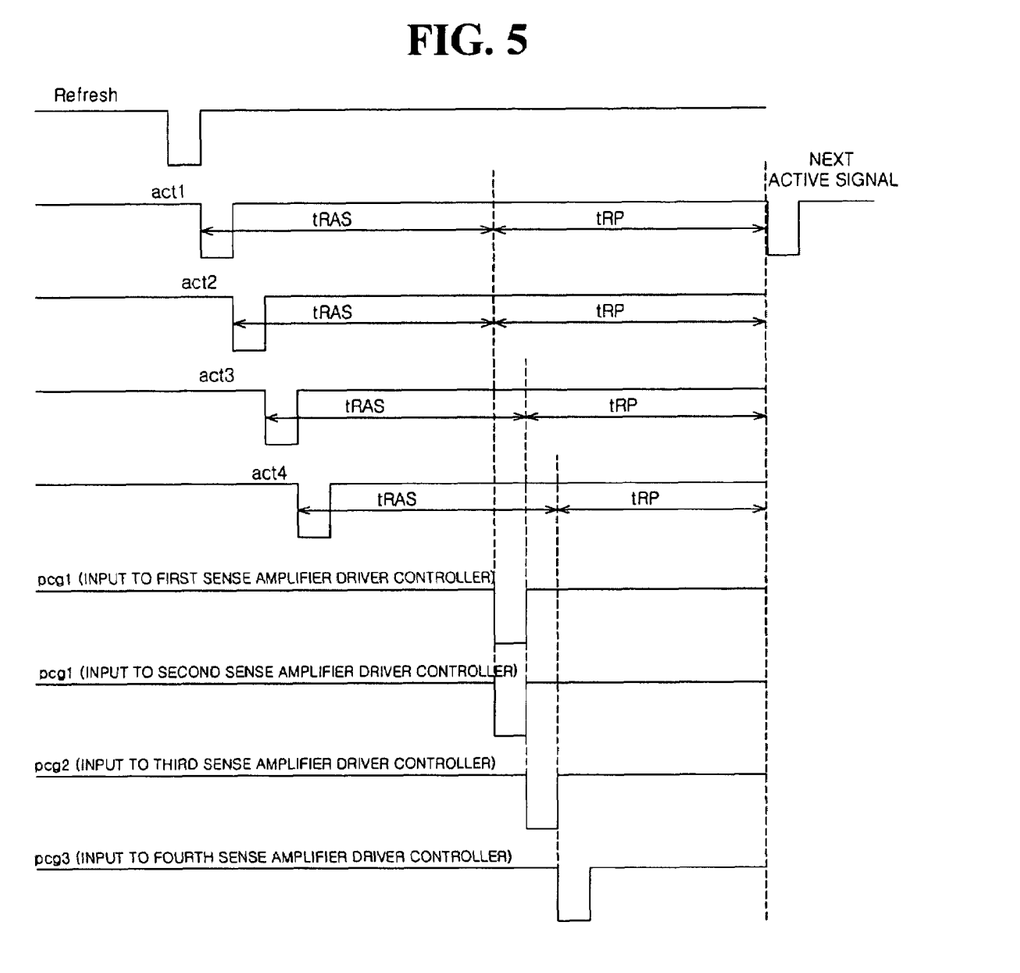
FIG. 5 is a timing chart illustrating the semiconductor memory apparatus according to another embodiment of the present invention.

Referring to FIG. 5, the first active signal act1, the second active signal act2, the third active signal act3, and the fourth active signal act4 are arranged in the order in which they are enabled. That is, the first active signal act1 has a fastest enable timing, and the fourth active signal act4 has a latest enable timing.

The first delay unit 210 receives the second active signal act2 to generate the first precharge signal pcg1. The first precharge signal pcg1 is commonly input to the first and second sense amplifier driver controllers 31 and 32. The first and second equalizer signals BLEQ1 and BLEQ2 are enabled at the same time. The third and fourth active signals act3 and act4 are input to the second delay unit 220 and the third delay unit 230, and then the second precharge signal pcg2 and the third precharge signal pcg3 are output, respectively. Therefore, the second precharge signal pcg2 is enabled faster than the third precharge signal pcg3. As a result, the third equalizer signal BLEQ3 is enabled faster than the fourth equalizer signal BLEQ4.

The time tRAS between the first active signal act1 and the first precharge signal pcg1 is longest. Meanwhile, the time tRAS between the second active signal act2 and the first precharge signal pcg1, the time tRAS between the third active signal act3 and the second precharge signal pcg2, and the time tRAS between the fourth active signal act4 and the third precharge signal pcg3 are the same.

Therefore, a time between the first pull-up and pull-down signals SAP1 and SB1 and the first equalizer signal BLEQ1 that are generated by the first active signal act1 and the first precharge signal pcg1 is longest. That is, the longest time is allocated to a bank that is affected by the first pull-up and pull-down signals SAP1 and SB1 and the first equalizer signal BLEQ1, such that the read/write operation is completed.

Figure 6:
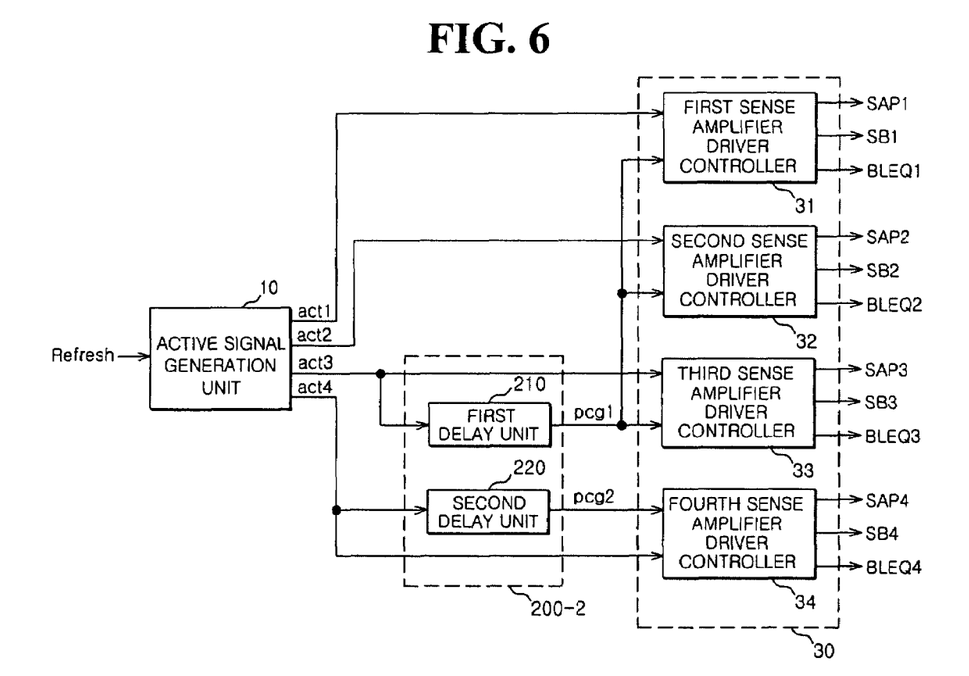
FIG. 6 is a diagram illustrating the detailed structure of a semiconductor memory apparatus according to still another embodiment of the present invention.

FIG. 6 is a diagram illustrating the detailed structure of a semiconductor memory apparatus according to another embodiment of the present invention. In this embodiment, it is assumed that the semiconductor memory apparatus includes four banks, each of which includes a sense amplifier driver and a sense amplifier driver controller. Further, it is assumed that a first active signal, a second active signal, a third active signal, and a fourth active signal are sequentially enabled. That is, the first active signal has a fastest enable timing.

An active signal generation unit 10 delays a refresh signal Refresh to generate first to fourth active signals act1 to act4 having different enable timings for generating four pull-up signals SAP1 to SAP4 and four pull-down signals SB1 to SB4.

A precharge signal generation unit 200-2 delays the third active signal act3 to generate a first precharge signal pcg1 for enabling first, second, and third equalizer signals BLEQ1, BLEQ2, and BLEQ3 at the same time. Further, the precharge signal generation unit 200-2 delays the fourth active signal act4 to generate a second precharge signal pcg2.

The precharge signal generation unit 200-2 includes first and second delay units 210 and 220. At this time, the first delay unit 210 and the second delay unit 220 receive the third active signal act3 and the fourth active signal act4, to generate the first and second precharge signals pcg1 and pcg2, respectively. Moreover, the first and second delay units 210 and 220 apply the same delay time.

The sense amplifier driver control unit 30 generates pull-up signals SAP1 to SAP4, pull-down signals SB1 to SB4, and equalizer signals BLEQ1 to BLEQ4 for controlling the individual sense amplifier drivers in response to the first to fourth active signals act1 to act4 and the first and second precharge signals pcg1 and pcg2.

The sense amplifier driver control unit 30 includes first to fourth sense amplifier driver controllers 31, 32, 33, and 34 that correspondingly receive the active signals act1 to act4 and the precharge signals pcg1 and pcg2. At this time, the first, second, and third sense amplifier driver controllers 31, 32, and 33 commonly receive the first precharge signal pcg1.

Figure 7:
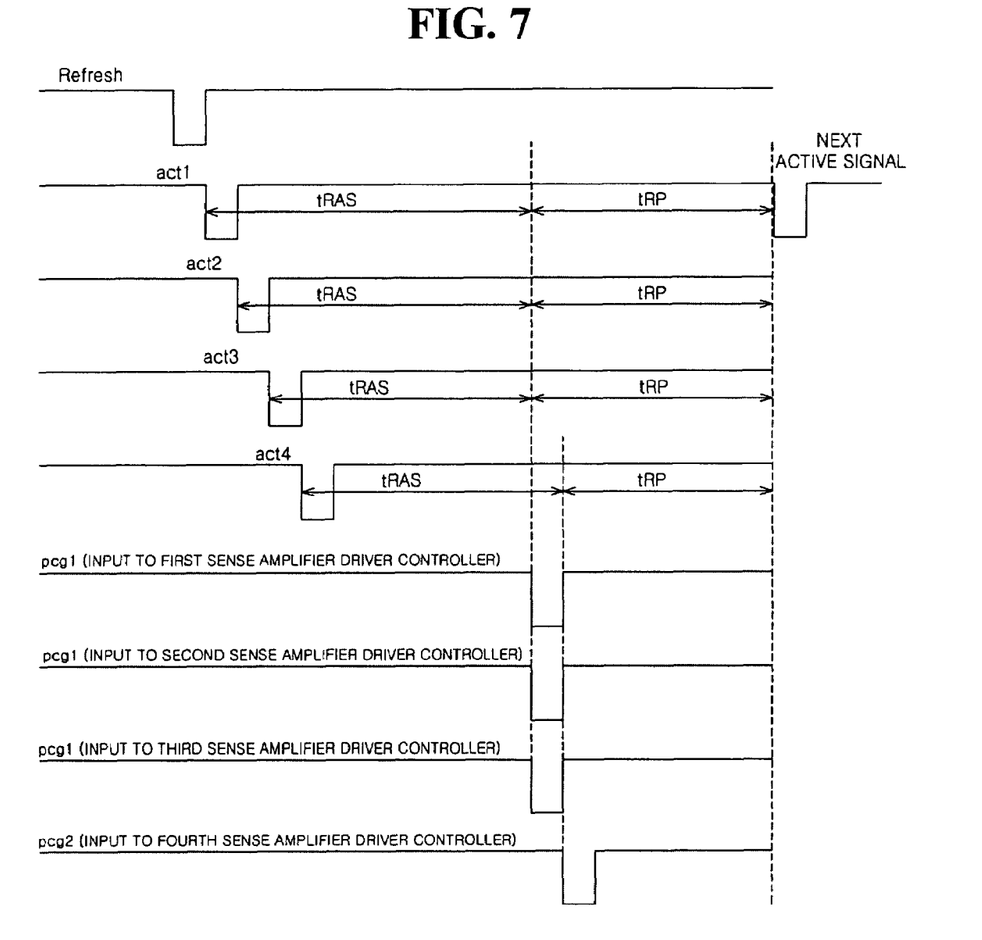
FIG. 7 is a timing chart illustrating the semiconductor memory apparatus according to still another embodiment of the present invention.

As shown in FIG. 7, the first active signal act1, the second active signal act2, the third active signal act3, and the fourth active signal act4 are arranged in the order in which they are enabled. That is, the first active signal act1 has a fastest enable timing, and the fourth active signal act4 has a latest enable timing.

The first delay unit 210 receives the third active signal act3 to generate the first precharge signal pcg1. The first precharge signal pcg1 is commonly input to the first, second, and third sense amplifier driver controllers 31, 32, and 33. Therefore, the first, second, and third equalizer signals BLEQ1, BLEQ2, and BLEQ3 are enabled at the same time. Further, the fourth active signal act4 is input to the second delay unit 220 and then the second precharge signal pcg2 is generated. Therefore, the first precharge signal pcg1 generated by the first delay unit 210 is enabled faster than the second precharge signal pcg2 generated by the second delay unit 220. As a result, the first, second, and third equalizer signals BLEQ1, BLEQ2, and BLEQ3 are enabled faster than the fourth equalizer signal BLEQ4.

The time tRAS between the first active signal act1 and the first precharge signal pcg1 is longest. The time tRAS between the second active signal act2 and the first precharge signal pcg1 is second longest. The time tRAS between the third active signal act3 and the first precharge signal pcg1, and the time tRAS between the fourth active signal act4 and the second precharge signal pcg2 are the same.

Therefore, a time between the first pull-up and pull-down signals SAP1 and SB1 and the first equalizer signal BLEQ1 that are generated in response to the first active signal act1 and the first precharge signal pcg1 is longest. Further, a time between the second pull-up and pull-down signals SAP2 and SB2 and the second equalizer signal BLEQ2 that are generated in response to the second active signal act2 and the first precharge signal pcg1 is second longest. Accordingly, the longest time is allocated to a bank that is affected by the first pull-up and pull-down signals SAP1 and SB1 and the first equalizer signal BLEQ1, such that the read/write operation is completed. Further, the second longest time is allocated to a bank that is affected by the second pull-up and pull-down signals and the second equalizer signal SAP2, SB2, and BLEQ2, such that the read/write operation is completed.

Figure 8:
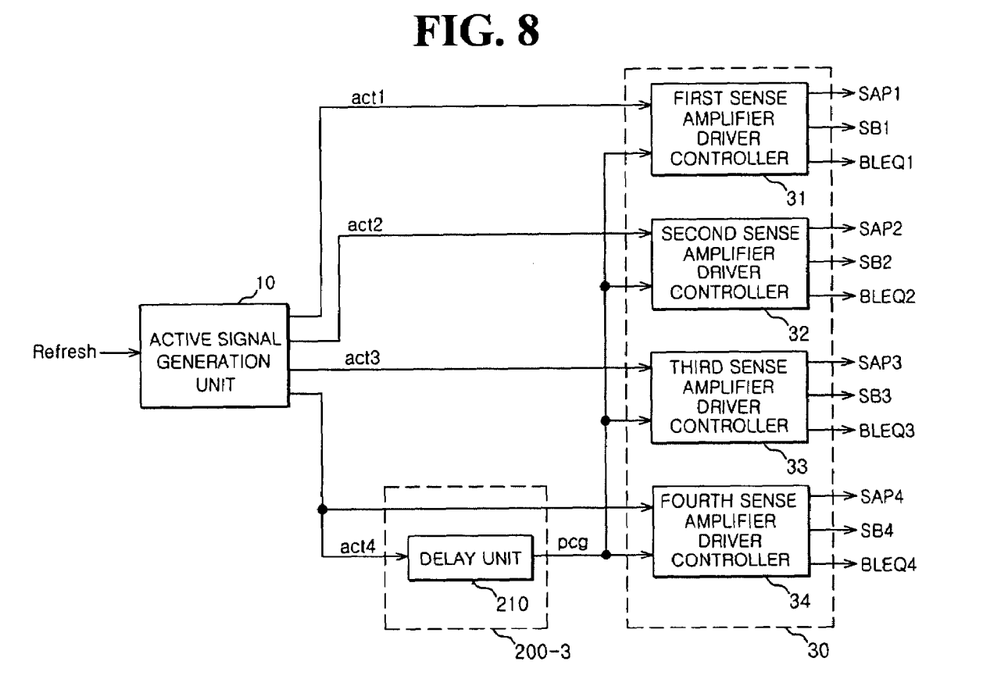
FIG. 8 is a diagram illustrating the detailed structure of a semiconductor memory apparatus according to yet still another embodiment of the present invention.

FIG. 8 is a diagram illustrating the detailed structure of a semiconductor memory apparatus according to still another embodiment of the present invention. At this time, it is assumed that the semiconductor memory apparatus includes four banks, each of which includes a sense amplifier driver and a sense amplifier driver controller. Further, it is assumed that active signals for activating the banks are enabled in such a way that the first active signal, the second active signal, the third active signal, and the fourth active signal are sequentially enabled. That is, the first active signal has a fastest enable timing.

An active signal generation unit 10 delays a refresh signal Refresh to generate first to fourth active signals act1 to act4 having different enable timings for generating four pull-up signals SAP1 to SAP4 and four pull-down signals SB1 to SB4.

A precharge signal generation unit 200-3 delays the fourth active signal act4 to generate a precharge signal pcg for enabling first to fourth equalizer signals BLEQ1, BLEQ2, BLEQ3, and BLEQ4 at the same time.

The precharge signal generation unit 200-3 includes a delay unit 210. At this time, the delay unit 210 receives the fourth active signal act4 to generate the precharge signal pcg.

The sense amplifier driver control unit 30 generates pull-up signals SAP1 to SAP4, pull-down signals SB1 to SB4, and equalizer signals BLEQ1 to BLEQ4 for controlling the individual sense amplifier drivers in response to the first to fourth active signals act1 to act4 and the precharge signal pcg.

The sense amplifier driver control unit 30 includes first to fourth sense amplifier driver controllers 31, 32, 33, and 34 that correspondingly receive the active signals act1 to act4 and the precharge signal pcg. At this time, the first to fourth sense amplifier driver controllers 31, 32, 33, and 34 commonly receive the precharge signal pcg.

Figure 9:
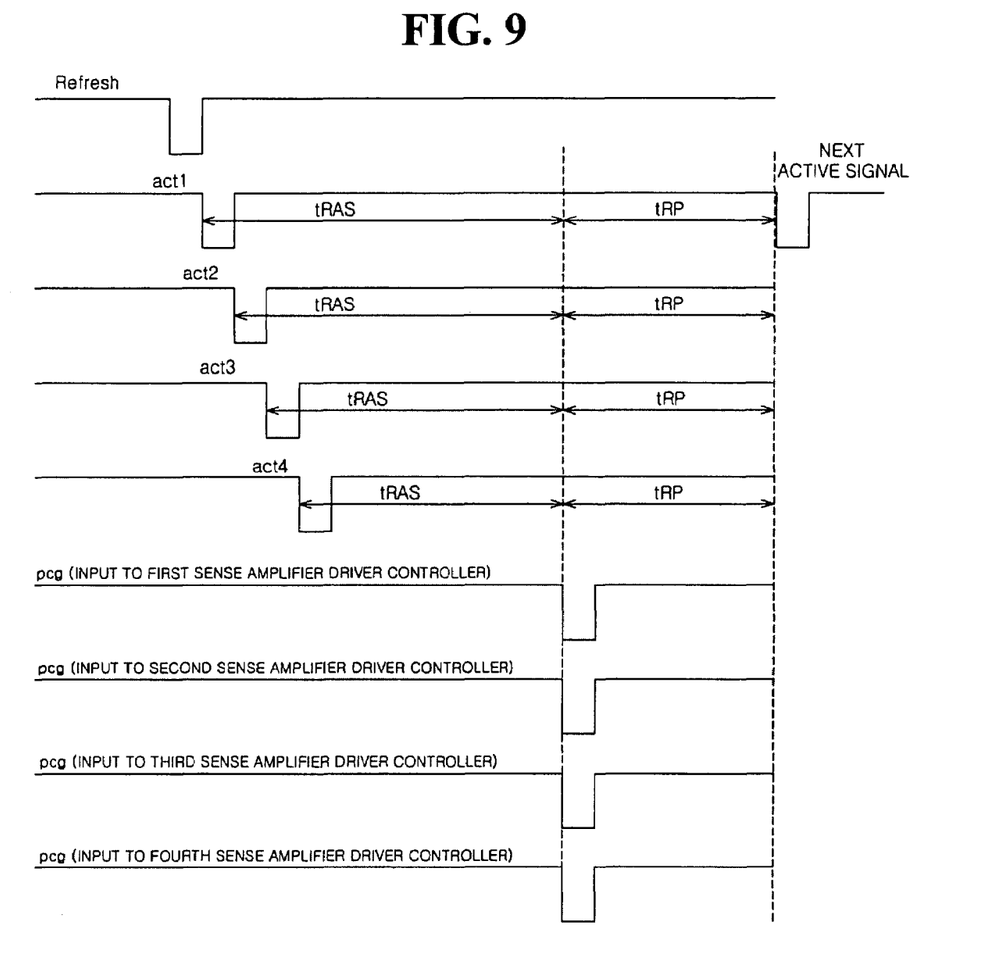
FIG. 9 is a timing chart illustrating the semiconductor memory apparatus according to yet still another embodiment of the present invention.

Referring to FIG. 9, the first active signal act1, the second active signal act2, the third active signal act3, and the fourth active signal act4 are arranged in the order in which they are enabled. That is, the first active signal act1 has a fastest enable timing, and the fourth active signal act4 has a latest enable timing.

The delay unit 210 receives the fourth active signal act4 to generate the precharge signal pcg. The precharge signal pcg is commonly input to the first to fourth sense amplifier driver controllers 31, 32, 33, and 34. Therefore, the first to fourth equalizer signals BLEQ1, BLEQ2, BLEQ3, and BLEQ4 are enabled at the same time.

The time tRAS between the first active signal act1 and the precharge signal pcg is longest. The time tRAS between the second active signal act2 and the precharge signal pcg is second longest. The time tRAS between the third active signal act3 and the precharge signal pcg is third longest. The time tRAS between the fourth active signal act4 and the precharge signal pcg is shortest.

Therefore, a time between the first pull-up and pull-down signals SAP1 and SB1 and the first equalizer signal BLEQ1 that are generated in response to the first active signal act1 and the precharge signal pcg is longest. A time between the second pull-up and pull-down signals SAP2 and SB2 and the second equalizer signal BLEQ2 that are generated in response to the second active signal act2 and the precharge signal pcg is second longest. A time between the third pull-up and pull-down signals SAP3 and SB3 and the third equalizer signal BLEQ3 that are generated by the third active signal act3 and the precharge signal pcg is third longest. Therefore, the longest time is allocated to a bank that is affected by the first pull-up and pull-down signals SAP1 and SB1 and the first equalizer signal and BLEQ1, such that the read/write operation is completed. Further, the second longest time is allocated to the bank that is affected by the second pull-up and pull-down signals SAP2 and SB2 and the second equalizer signal BLEQ2, such that the read/write operation is completed. In addition, the third longest time is allocated to the bank that is affected by the third pull-up and pull-down signals SAP3 and SB3 and the third equalizer signal BLEQ3, such that the read/write operation is completed.

As a result, a bank that has the slowest response speed is to be affected by the first pull-up and pull-down signals SAP1 and SB1 and the first equalizer signal BLEQ1. Further, a bank that has the fastest response speed is to be affected by the fourth pull-up and pull-down signals SAP4 and SB4 and the fourth equalizer signal BLEQ4. In this way, it is possible to reduce an error in the bank that is generated due to the response speed of each bank with respect to the read/write operation.

Figure 10:
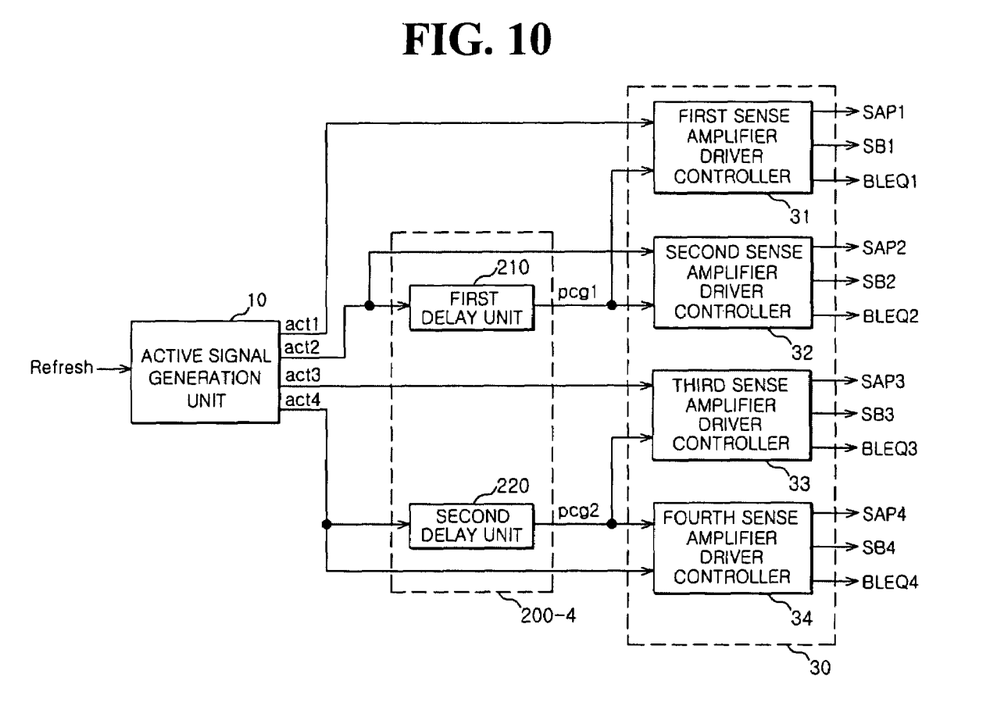
FIG. 10 is a diagram illustrating the detailed structure of a semiconductor memory apparatus according to yet still another embodiment of the present invention.

FIG. 10 is a diagram illustrating the detailed structure of a semiconductor memory apparatus according to yet still another embodiment of the present invention. Similarly to the above-described embodiments, it is assumed that the semiconductor memory apparatus according to this embodiment includes four banks, each of which includes a sense amplifier driver and a sense amplifier driver controller. Further, the active signals for activating the banks are enabled in such a way that the first active signal, the second active signal, the third active signal, and the fourth active signal are sequentially enabled. That is, the first active signal is enabled fast.

An active signal generation unit 10 delays a refresh signal Refresh to generate first to fourth active signals act1 to act4 having different enable timings for generating four pull-up signals SAP1 to SAP4 and four pull-down signals SB1 to SB4.

A precharge signal generation unit 200-4 delays the second active signal act2 to generate a first precharge signal pcg1 for enabling first and second equalizer signals BLEQ1 and BLEQ2 at the same time. Further, the precharge signal generation unit 200-4 delays the fourth active signal act4 to generate a second precharge signal pcg2 for enabling third and fourth equalizer signals BLEQ3 and BLEQ4 at the same time.

The precharge signal generation unit 200-4 includes first and second delay units 210 and 220. At this time, the first delay unit 210 and the second delay unit 220 receive the second active signal act2 and the fourth active signal act4, to generate the first and second precharge signals pcg1 and pcg2, respectively. Moreover, the first and second delay units 210 and 220 apply the same delay time.

A sense amplifier driver control unit 30 generates pull-up signals SAP1 to SAP4, pull-down signals SB1 to SB4, and equalizer signals BLEQ1 to BLEQ4 for controlling the individual sense amplifier drivers in response to the first to fourth active signals act1 to act4 and the first and second precharge signals pcg1 and pcg2.

The sense amplifier driver control unit 30 includes first to fourth sense amplifier driver controllers 31, 32, 33, and 34 that correspondingly receive the active signals act1 to act4 and the first and second precharge signals pcg1 and pcg2. At this time, the first and second sense amplifier driver controllers 31 and 32 commonly receive the first precharge signal pcg1, and the third and fourth sense amplifier driver controllers 33 and 34 commonly receive the second precharge signal pcg2.

Figure 11:
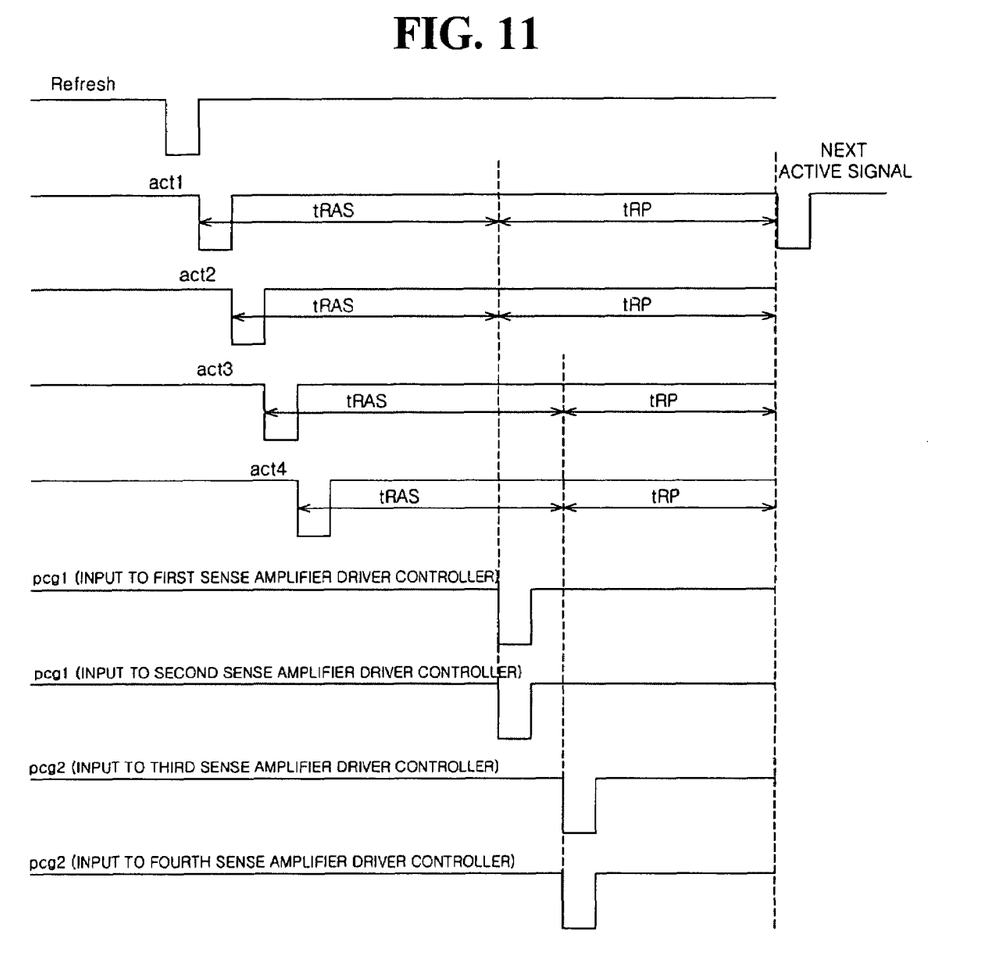
FIG. 11 is a timing chart illustrating the semiconductor memory apparatus according to yet still another embodiment of the present invention.

Referring to FIG. 11, the first active signal act1, the second active signal act2, the third active signal act3, and the fourth active signal act4 are arranged in the order in which they are enabled. That is, the first active signal act1 has a fastest enable timing, and the fourth active signal act4 has a latest enable timing.

The first delay unit 210 receives the second active signal act2 to generate the first precharge signal pcg1. The first precharge signal pcg1 is commonly input to the first and second sense amplifier driver controllers 31 and 32. Therefore, the first and second equalizer signals BLEQ1 and BLEQ2 are enabled at the same time. Further, the second delay unit 220 receives the fourth active signal act4 to generate the second precharge signal pcg2. The second precharge signal pcg2 is commonly input to the third and fourth sense amplifier driver controllers 33 and 34. Therefore, the third and fourth equalizer signals BLEQ3 and BLEQ4 are enabled at the same time. The first and second equalizer signals BLEQ1 and BLEQ2 have the same enable timing. Further, the third and fourth equalizer signals BLEQ3 and BLEQ4 have the same enable timing.

The tRAS between the first active signal act1 and the first precharge signal pcg1 is longer than a time between the second active signal act2 and the first precharge signal pcg1. Further, the time tRAS between the third active signal act3 and the second precharge signal pcg2 is longer than a time between the fourth active signal act4 and the second precharge signal pcg2.

Therefore, a time between the first pull-up and pull-down signals SAP1 and SB1 and the first equalizer signal BLEQ1 is longer than a time between the second pull-up and pull-down signals SAP2 and SB2 and the second equalizer signal BLEQ2. Further, a time between the third pull-up and pull-down signals SAP3 and SB3 the third equalizer signal BLEQ3 is longer than a time between the pull-up and pull-down signals SAP4 and SB4 and the fourth equalizer signal BLEQ4.

As a result, a bank that is affected by the first pull-up and pull-down signals SAP1 and SB1 and the first equalizer signal BLEQ1, and a bank that is affected by the third pull-up and pull-down signals SAP3 and SB3 and the third equalizer signal BLEQ3 are allocated with a longer time, compared with other banks, such that the read/write operation is completed.

In the semiconductor memory apparatus having the above-described structure, when banks that have a slow response speed is controlled by the first and third pull-up and pull-down signals SAP1, SB1, SAP3, and SB3 and the first and third equalizer signals BLEQ1 and BLEQ3, it is possible to reduce an error in the bank that is generated due to the response speed.

The sense amplifier driver control circuit of the semiconductor memory apparatus according to the embodiments of the present invention can allocate different amounts of time during which the write or read operation is completed to the bank, thereby reducing an error in the bank. Further, the semiconductor memory apparatus according to the embodiments of the present invention ensures the minimum read/write operating time in compliance with the JEDEC standards and extends the time as much as needed.

Further, since the delay units are shared to thereby reduce the area of the precharge signal generation unit, the reduction in area of the semiconductor memory apparatus can be achieved.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

What is claimed is:

1. A semiconductor memory apparatus comprising:
an active signal generation unit that generates a plurality of active signals having different enable timings in response to a refresh signal;
a precharge signal generation unit that delays at least one active signal to generate at least one precharge signal for enabling at least two equalizer signals at the same time; and
a sense amplifier driver control unit that generates the plurality of equalizer signals for controlling individual sense amplifier drivers in response to the plurality of active signals and the precharge signal.

2. The semiconductor memory apparatus of claim 1, wherein the precharge signal generation unit that delays the active signals excludes one active signal having a fastest enable timing to generate the at least one precharge signal.

3. The semiconductor memory apparatus of claim 2, wherein the precharge signal generation unit includes a plurality of delay units that delay the active signals to output the precharge signal, and
a number of delay units is smaller than a number of active signals.

4. The semiconductor memory apparatus of claim 3, wherein the delay units apply the same delay time.

5. The semiconductor memory apparatus of claim 1, wherein the sense amplifier drive control unit includes a plurality of sense amplifier driver controllers that generate the equalizer signals corresponding to the sense amplifier drivers.

6. The semiconductor memory apparatus of claim 5, wherein two or more sense amplifier driver controllers among the plurality of sense amplifier driver controllers commonly receive the precharge signal.

7. A semiconductor memory apparatus comprising:
an active signal generation unit that generates a plurality of active signals having different enable timings in response to a refresh signal;
a precharge signal generation unit that delays one active signal having a latest enable timing to generate a precharge signal for enabling all equalizer signals; and
a sense amplifier driver control unit that generates the plurality of equalizer signals for controlling individual sense amplifier drivers in response to the plurality of active signals and the precharge signal,
wherein the precharge signal generation unit includes delay units, a number of which is smaller than a number of active signals.

8. The semiconductor memory apparatus of claim 7, wherein the sense amplifier driver control unit includes a plurality of sense amplifier driver controllers that generate the equalizer signals corresponding to the sense amplifier drivers.

9. The semiconductor memory apparatus of claim 8, wherein the plurality of sense amplifier driver controllers commonly receive the precharge signal.

10. A semiconductor memory apparatus comprising:
an active signal generation unit that generates a plurality of active signals having different enable timings in response to a refresh signal;
a sense amplifier driver control unit that includes a plurality of sense amplifier driver controllers, each of which receives the corresponding active signal and a precharge signal; and
a precharge signal generation unit that includes at least one delay unit for delaying at least one of the active signals and outputting the precharge signal,
wherein at least one precharge signal is commonly output to at least two sense amplifier driver controllers, and
a number of delay units is smaller than a number of active signals.

11. The semiconductor memory apparatus of claim 10, wherein the precharge signal generation unit that delays the active signals excludes one active signal having a fastest enable timing to output the precharge signal.

12. The semiconductor memory apparatus of claim 10, wherein the delay units apply the same delay time.

* * * * *